United States Patent [19]
Kitao

[11] Patent Number: 6,133,756
[45] Date of Patent: Oct. 17, 2000

[54] OUTPUT BUFFER CONTROL CIRCUIT

[75] Inventor: Ichiro Kitao, Kanagawa, Japan

[73] Assignee: NEC Corporation, Tokyo, Japan

[21] Appl. No.: 09/266,888

[22] Filed: Mar. 12, 1999

[30] Foreign Application Priority Data

Mar. 13, 1998 [JP] Japan .................................. 10-062718

[51] Int. Cl.⁷ .............................................. H03K 19/0175
[52] U.S. Cl. .................................... 326/83; 68/81
[58] Field of Search ................................. 326/63, 68, 80, 326/81, 82, 83

[56] References Cited

U.S. PATENT DOCUMENTS 5,534,801  7/1996  Wu et al. .................................... 327/72
6,060,905  5/2000  Bickford et al. .......................... 326/81

FOREIGN PATENT DOCUMENTS 3-247013  11/1991  Japan .

Primary Examiner—Michael Tokar
Assistant Examiner—Anh Tran
Attorney, Agent, or Firm—McGinn & Gibb, P.C.

[57] ABSTRACT

An output buffer control circuit in which an amplitude of a gate input of a MOS transistor for the output's sake is variable by virtue of a program or a mask option, thus there is no electromagnetic interference caused by excessive output current and unnecessary current consumption, is suitable in use for universal integrated circuit. A gate voltage selector circuit selects one out of three voltages ($V_{DD}+\alpha$), $V_{DD}$, and ($V_{DD}-\beta$) in accordance with the combination of selection signals $S_1$, $S_2$, and $S_3$. A level conversion circuit performs ON-OFF of a voltage $V_1$ selected by the gate voltage selector circuit in accordance with a source output signal to be outputted to an outer section with the same cycle as the source output signal, thus communicating it as a gate input to an n-MOS transistor of an output buffer. It is equivalent to that it causes amplitude $V_{DD}$ of the source output signal to be performed level conversion toward the voltage $V_1$ which the gate voltage selector circuit selects. It is capable of being obtained the optimum output current because the amplitude $V_1$ undergoing the level conversion is variable by virtue of the selection signals $S_1$, $S_2$, and $S_3$.

18 Claims, 6 Drawing Sheets

2 GATE VOLTAGE SELECTOR CIRCUIT 6A, 6B, 6C  INVERTER
7A, 7B, 7C  LEVEL SHIFTER

OUTPUT BUFFER CONTROL CIRCUIT

BACKGROUND OF THE INVENTION

The present invention relates to an output buffer control circuit of a semiconductor integrated circuit. More to particularly, this invention relates to gate voltage control technology in an output buffer capable of being changed output current value by enabling gate voltage value of output transistor to be changed.

DESCRIPTION OF THE PRIOR ART

In the semiconductor integrated circuit, output current from the integrated circuit is one of the important characteristic. The output current from the semiconductor integrated circuit is the maximum permissible current which the output buffer can flow. For instance, one provision of the standard of the integrated circuit is low level output current $I_{OL}$. In this low level output current $I_{OL}$, there is a specification that an output buffer capable of being outputted large current is necessary in order to drive the light emitting diode (LED) directory in comparison with another output buffer. By way of one example, low level output current is as being $I_{OL}$=20 mA under the condition that power source voltage is as being $V_{DD}$=1.8 to 5.5 V, and low level output voltage is as being $V_{OL}$=0.4 V.

When there is used the MOS transistor for outputting, the MOS transistor enables the output current to flow as being $I=\frac{1}{2}\times\mu\times C_{OX}\times W/L\times(V_{GS}-V_{th})^2$, (only, $\mu$ being mobility of carrier, $C_{OX}$ being electrostatic capacity of gate insulating film, W being channel width, L being channel length, $V_{GS}$ being gate-source voltage and $V_{th}$ being threshold value voltage). In the formula of the above-described output current, there is roughly determined the mobility $\mu$ in accordance with carrier density. The mobility $\mu$ has a inclination to increase with decreasing carrier density, however, since it shows saturation tendency, it can not be enlarged exceeding one predetermined value. In the meantime, there is a method for increasing the output current such that it permits the gate insulating film to become thin to be enlarged the gate capacity $C_{OX}$ and it permits the channel length L to be shortened. However, this method may induce the lowering of reliability in that there is accompanied with not only difficulty on manufacture but also destruction of insulating film or origination of hot carrier, and variation of the threshold value voltage $V_{TH}$. Furthermore, the gate-source voltage $V_{GS}$ or the threshold value voltage $V_{TH}$ of the transistor is limited by condition of the circuit so that degree of freedom is small.

Under the existing conditions, formerly, there is generally implemented that it causes the output current to be enlarged by making the channel width W of the MOS transistor for the output sake larger. In particular, the integrated circuit of low power source voltage, whose gate-source voltage $V_{GS}$ is small, causes the channel width W of the output transistor to be enlarged for guaranteeing the low level output current $I_{OL}$. However, this method generates the evil that chip size is enlarged so that cost rises. Generally, the output buffer is arranged in the neighborhood of a pad electrode (connecting electrode for outer section) on the chip, consequently, in recent years, manufacturing process is subdivided so that the chip size is determined by circumference of the pad electrode. Namely, when there is enlarged the channel width W of the output MOS transistor, it is connected directly with enlargement of the chip size.

There is disclosed the technique enabling a large current output in the Japanese Patent Application Laid-Open No. HEI 3-247013. The technique causes the gate-source voltage $V_{GS}$ of the outputting transistor to be increased than the power source voltage $V_{DD}$, thus increasing the gate-source voltage $V_{GS}$ than the case of the conventional output buffer by way of another method which enables the output current to be increased. FIG. 1 is a circuit view showing a modified output buffer from the original one described in the above Official gazette. Referring to FIG. 1, the output buffer causes a step-up circuit 20 to boost the power source voltage $V_{DD}$ to the voltage $V_{CC}$ larger than the power source voltage, thus applying the voltage $V_{CC}$ by way of power source voltage of the inverters 26, and 27 with the CMOS configuration. For that reason, the inverters 26, and 27 for driving the n-MOS transistor $Q_{N0}$ for the output sake drives the output transistor $Q_{N0}$ by the gate input which is larger than the power source voltage $V_{DD}$, thus even though there is used the output transistor with the same channel width as the conventional one, it is capable of enlarging the output current which can flow therein.

The output buffer according to the Japanese Patent Application Laid-Open No. HEI 3-247013 is capable of increasing output current into large current without enlarging a channel width W of the MOS transistor for the output's sake, namely, without increasing chip size. However, the output buffer not only causes unnecessary dissipation current to be increased while outputting large current more than necessity, but also accompanies side effect that it causes Electromagnetic Interference to be inspired because of fluctuation of power source or ground electric potential in accompanying with flowing in or flowing out of large output current. Namely, referring to FIG. 1, in the case of the above output buffer, the amplitude of the gate input (output signal voltage of the inverter 27) of the n-MOS transistor $Q_{N0}$ for the output's sake is the output voltage $V_{CC}$ of the step-up circuit 20. However, since a step-up output voltage $V_{CC}$ of the step-up circuit 20 is determined by the power source voltage $V_{DD}$, finally, the amplitude of the gate input of the transistor $Q_{N0}$ depends on the power source voltage $V_{DD}$.

Here, supposing that the output buffer whose power source voltage $V_{DD}$, even though, is minimum value, can ensure the output current. In this case, when the power source voltage $V_{DD}$ fluctuates in the maximum direction, or when there is used the semiconductor integrated circuit with the output buffer to the application device with high power source voltage, the electromagnetic interference is increased because the output current is too large. Furthermore, there is wasted unnecessary dissipation current. While, in the output buffer in which when the power source voltage $V_{DD}$ is maximum, it is capable of being ensured the necessary output current, so that when the power source voltage $V_{DD}$ is of minimum, it is incapable of being ensured the necessary output current.

Further, the output buffer described in the above Official Gazette can not be applied to the universal integrated circuit. Because, since the gate voltage of the transistor $Q_{N0}$ for the output's sake is fixed to the output voltage $V_{CC}$ of the step-up circuit 20 at the design stage of the integrated circuit, it is incapable of coping with the plurality of output currents required by the various kinds of application devices.

SUMMARY OF THE INVENTION

In view of the foregoing, it is an object of the present invention in order to achieve the above-described problems to provide an output buffer control circuit which enables a gate voltage of a MOS transistor for the output's sake to be variable in accordance with a program for the respective users or a mask option, thus enabling optimum output current to be applied to integrated circuit application device, without electromagnetic interference caused by excessive output current and unnecessary current consumption.

It is another object of the present invention to provide an output buffer control circuit in which a gate voltage of the MOS transistor for the output's sake is variable, thus it is capable of being changed into plural kinds of output currents required by respective kinds of application device, so that the output buffer control circuit is easy to apply to universal integrated circuit.

According to a first aspect of the present invention, in order to achieve the above-mentioned objects, there is provided an output buffer control circuit which comprises a plurality of voltage source terminals to which direct current voltages whose respective voltage values are different from one another are inputted, an insulated gate field-effect transistor for supplying current to an output terminal, a voltage selection means for selecting one voltage out of a plurality of direct current voltages inputted to the plurality of voltage source terminals, and a means for inputting an output voltage of the voltage selection means to a gate electrode of the insulated gate field-effect transistor accompanying with the same cycle as that of a source output signal in answer to the source output signal to be outputted to outer section.

According to a second aspect of the present invention, in the first aspect, there is provided an output buffer control circuit, wherein the output voltage of the voltage selection means is a voltage which is selected in the manufacturing process to be fixed.

According to a third aspect of the present invention, in the first aspect, there is provided an output buffer control circuit, wherein the output voltage of the voltage selection means is capable of being changed selectively into any one of the plurality of the direct current voltages in accordance with a programmed control signal from the outer section.

According to a fourth aspect of the present invention, there is provided an output buffer control circuit which comprises a plurality of voltage source terminals to which direct current voltages whose respective voltage values are different from one another are inputted, an insulated gate field-effect transistor for the output's sake supplying current to an output terminal, a level conversion means to which there are inputted any one voltage out of a plurality of direct current voltages inputted to the plurality of voltage source terminals, and a source output signal to be outputted through the insulated gate field-effect transistor for the output's sake inputted from the outer section, for supplying the inputted one voltage with the same cycle as that of the source output signal in answer to the source output signal by way of a gate input of the insulated gate field-effect transistor, while for interrupting the inputted one voltage if not, and an electrical wiring provided between any one of the plurality of voltage source terminals and a voltage input point of the level conversion means.

According to a fifth aspect of the present invention, there is provided an output buffer control circuit which comprises a plurality of voltage source terminals to which direct current voltages whose respective voltage values are different from one another are inputted, a voltage selection means for selecting one voltage out of a plurality of direct current voltages inputted to the plurality of voltage source terminals in answer to a programmed control signal inputted from the outer section, an insulated gate field-effect transistor for the output's sake supplying current to output terminals, and a level conversion means intervening between the voltage selection means and the insulated gate field-effect transistor for the output's sake, for supplying a voltage which the voltage selection means selects to be outputted with the same cycle as that of the source output signal in answer to the source output signal to be outputted through the insulated gate field-effect transistor for the output's sake by way of a gate input of the insulated gate field-effect transistor for the output's sake, while for interrupting the voltage if not.

According to a sixth aspect of the present invention, wherein there is provided a first output buffer control circuit consisting of the output buffer control circuit described in the fifth aspect, and a second output buffer control circuit consisting of the level conversion means and the insulated gate field effect transistor for the output's sake described in the fifth aspect, in which there is connected a voltage input point of the level conversion means of the first output buffer control circuit to voltage input point of the level conversion means of the second output buffer control circuit in common therewith, thus causing the voltage selection means of the first output buffer control circuit to be held in common by both of the first output buffer control circuit and the second output buffer control circuit.

According to a seventh aspect of the present invention, wherein there are provided a plurality of output buffer control circuits described in the fifth aspect, there are connected corresponding voltage source terminals respectively in common among respective output buffer control circuits.

According to an eighth aspect of the present invention, there is provided an output buffer control circuit which comprises voltage source terminals of N (N is natural number more than 2) pieces, to which direct current voltages whose respective voltage values are different from one another are inputted, n-channel MOS field-effect transistor for the output's sake, which is connected so as to provide a current path between the output terminal and the grounded electric potential point, a voltage selection means provided with N sets of change-over circuits including p-channel MOS field-effect transistor and an analog switch for performing ON-OFF in terms of a gate electrode of the p-channel MOS field-effect transistor and a high voltage source in accordance with binary control signal from an outer section, for applying a voltage of a voltage source terminal of the maximum electric potential to the high voltage source of respective the change-over circuits, for assigning to be applied N pieces of direct current voltages inputted to said N pieces of voltage source terminals toward a source electrode of the p-channel MOS field-effect transistor of respective the change-over circuits, and for assigning to be applied N pieces of binary control signals from the outer section by way of the binary control signal of respective the change-over circuits, and causing a drain electrode of the p-channel MOS field-effect transistor of respective the change-over circuit to be connected in common, and a level conversion means provided between a voltage source and a gate electrode of the n-channel MOS field-effect transistor for the output's sake, as being level conversion means consisting of switches performed ON-OFF in accordance with a source output signal to be outputted to the outer section through the n-channel MOS field-effect transistor for the output's sake, and the voltage source is connected to common drain electrode of N pieces p-channel MOS field-effect transistor of the voltage selection means.

According to a ninth aspect of the present invention, there is provided an output buffer control circuit which comprises voltage source terminals of N (N is natural number more than 2) pieces, to which direct current voltages whose respective voltage values are different from one another are inputted, an n-channel MOS field-effect transistor for the output's sake, which is connected so as to provide a current path between the output terminal and the grounded electric potential point, a voltage selection means provided with N sets of change-over circuits generating binary control signal in answer to the binary control signal by changing two current paths provided in parallel between high-level voltage source and grounded electric potential point using binary control signal from the outer section and an inversion signal thereof, and controlling ON-OFF of p-channel MOS field-effect transistor using the generated binary control signal, for applying a voltage of a voltage source terminal of the maximum electric potential to the high voltage source of respective the change-over circuits, for assigning to be applied N pieces of direct current voltages inputted to the N pieces of voltage source terminals toward a source electrode of the p-channel MOS field-effect transistor of respective the change-over circuits, and for assigning to be applied N pieces of binary control signals from the outer section by way of the binary control signal of respective the change-over circuits, and causing a drain electrode of the p-channel MOS field-effect transistor of respective the change-over circuit to be connected in common, and a level conversion means in which the voltage source is connected to common drain electrode of N pieces of p-channel MOS field-effect transistor of the voltage selection means, as being a level conversion means for generating binary control signal whose cycle is the same as the source output signal and whose amplitude has the same high level as voltage of the voltage source and for applying by way of a gate input of the n-channel MOS field-effect transistor for the output's sake, by changing current path provided in parallel between the voltage source and the grounded electric potential point by means of source output signal and inversion signal generated therefrom while inputting the source output signal to be outputted through the n-channel MOS field-effect transistor for the output's sake.

According to a tenth aspect of the present invention, in any one of the first aspect to the ninth aspect, there is provided an output buffer control circuit, wherein a plurality of voltage source terminals to which the direct current voltages whose voltage values are different from one another are inputted, are a voltage source terminal to which there is inputted the power source voltage, a voltage source terminal to which there is inputted the direct current voltage higher than the power source voltage, and a voltage source terminal to which there is inputted the direct current voltage lower than the power source voltage.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

Figure 1:
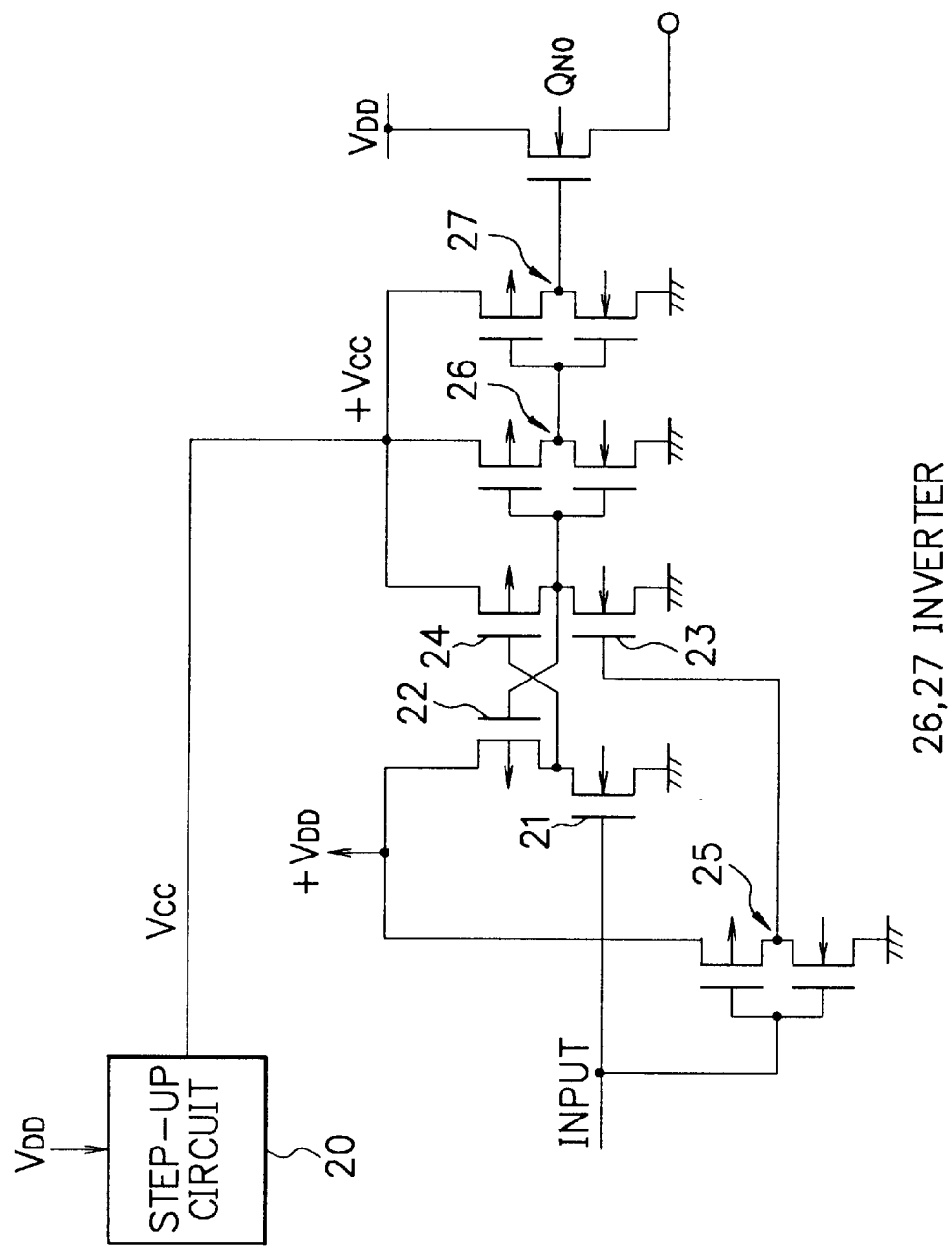
FIG. 1 is a circuit view showing one example of an output buffer control circuit according to the prior art.
Figure 2:
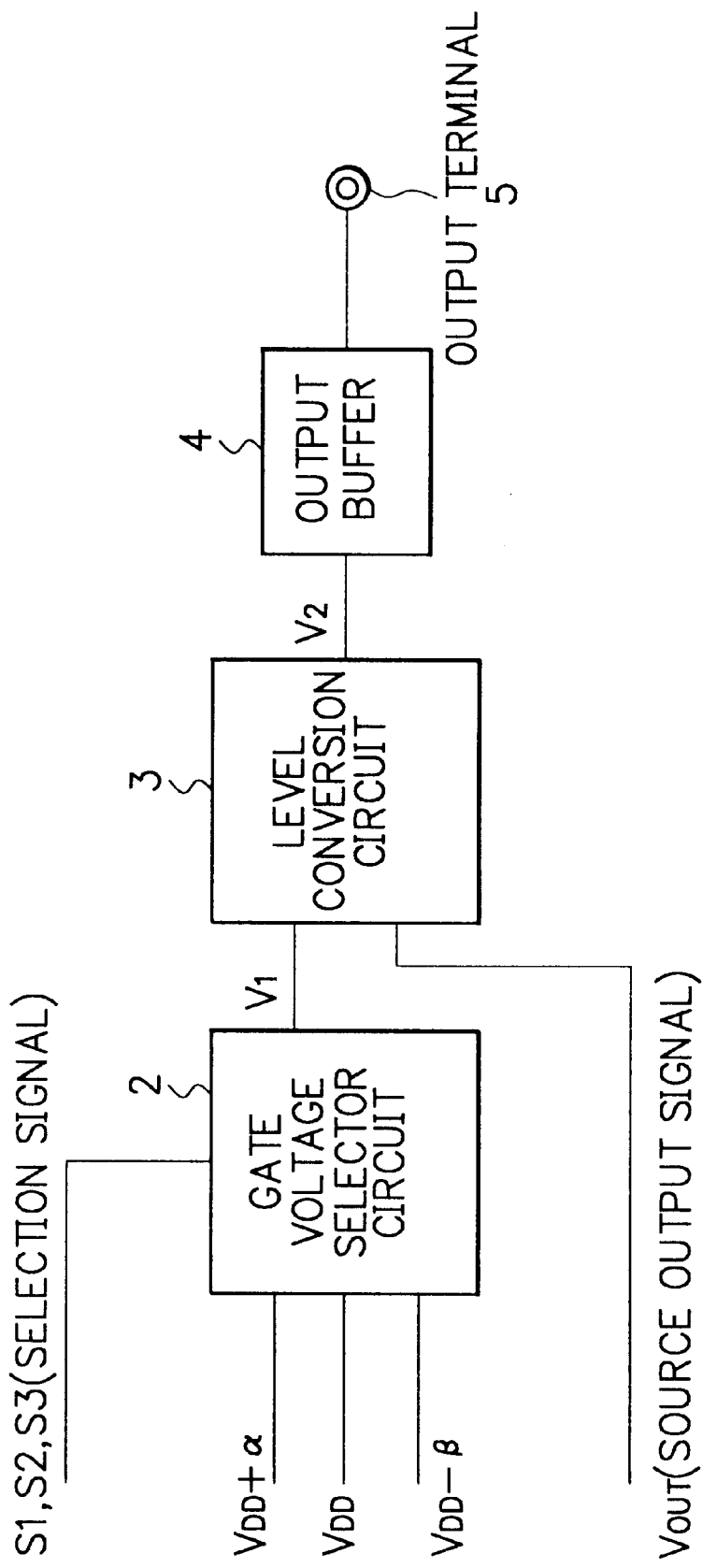
FIG. 2 is a block diagram showing a configuration of an output buffer control circuit of the present invention.
Figure 4:
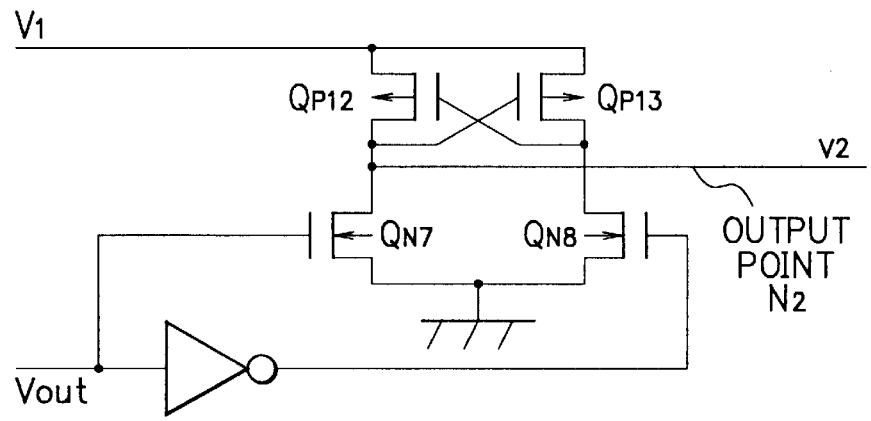
FIG. 4 is a circuit view showing a level conversion circuit according to the first embodiment.
Figure 5:
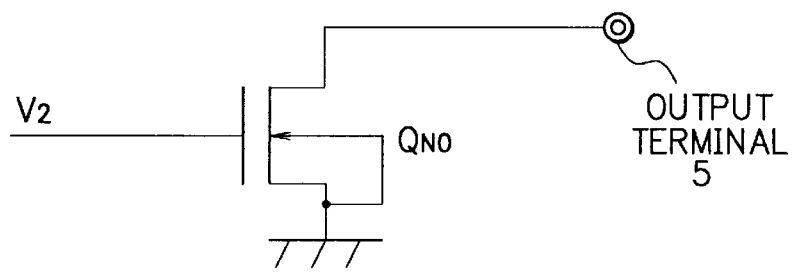
FIG. 5 is a circuit view showing an output buffer according to the first embodiment.

A preferred embodiment of the present invention will be described in detail in accordance with the accompanying drawings. FIG. 2 is a block diagram showing an output buffer control circuit according to the present invention. Referring to FIG. 2, the output buffer control circuit 1 of the present invention comprises a gate voltage selector circuit 2, a level conversion circuit 3, and an output buffer 4. One example of each of the gate voltage selector circuit 2, the level conversion circuit 3, and the output buffer 4 are shown in FIG. 3, FIG. 4, and FIG. 5.

Referring to FIG. 2, the gate voltage selector circuit 2 selects one voltage out of three DC voltages ($V_{DD}+\alpha$), $V_{DD}$, ($V_{DD}-\beta$) inputted from the outer section in accordance with combination of selection signals $S_1$, $S_2$, and $S_3$. The level conversion circuit 3 changes DC output voltage $V_1$ of the gate voltage selector circuit 2 into ON and OFF in answer to signal $v_{out}$ to be outputted to the outer section, thus applying it by way of a gate input $v_2$ of an n-MOS transistor constituting the output buffer 4. Namely, there is performed the level conversion of amplitude of a gate input of the n-MOS transistor $Q_{N0}$ for the output's sake (FIG. 5) from an amplitude $V_{DD}$ of the source output signal $v_{out}$ to the output voltage $V_1$ of the gate voltage selector circuit 2. The output buffer 4 comprises an n-MOS transistor $Q_{N0}$ whose source is grounded and whose drain is open, thus supplying output current toward the load at the outer section through the output terminal 5 in answer to the gate input $v_2$ outputted by the level conversion circuit 3.

Figure 3:
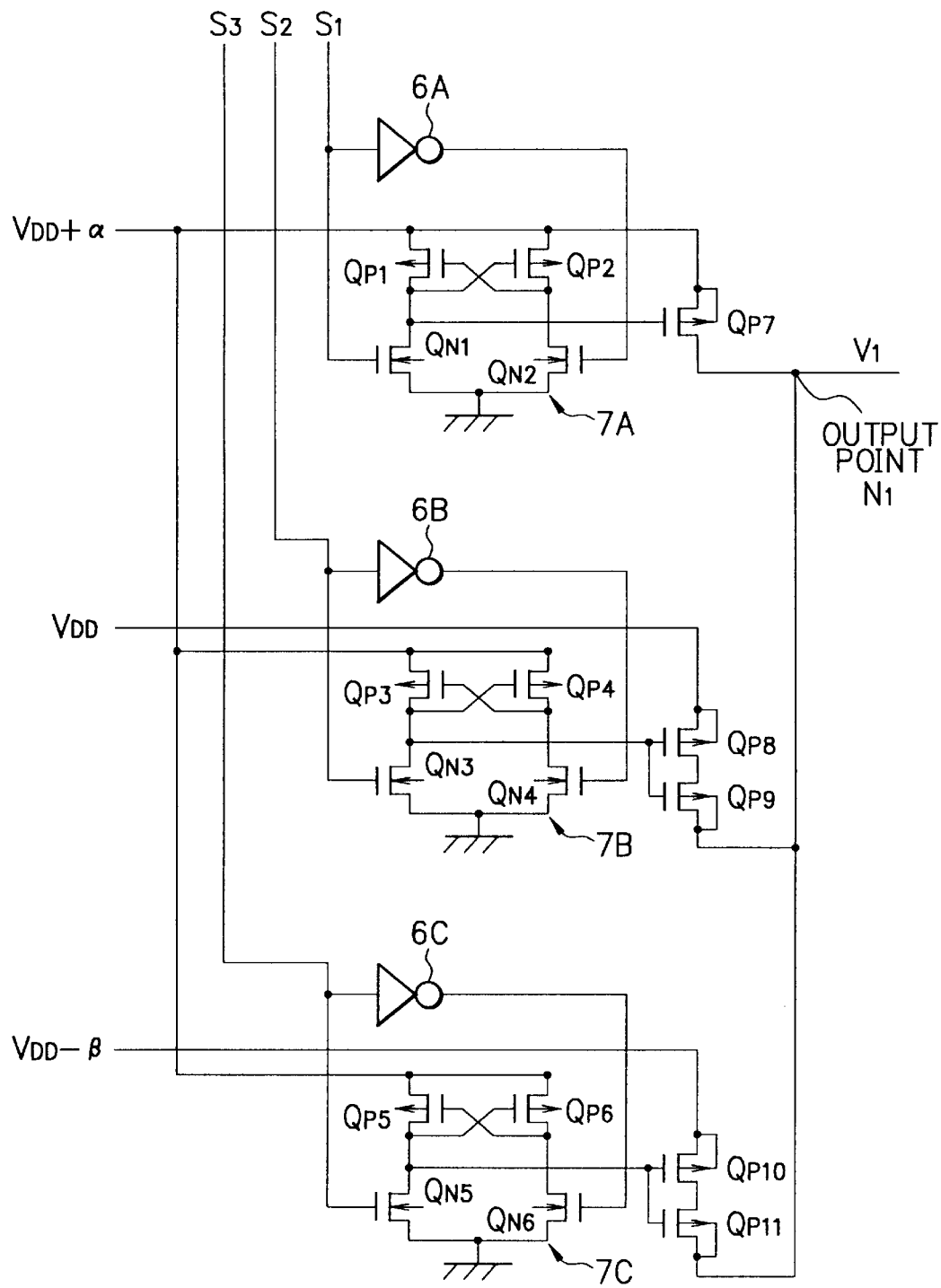
FIG. 3 is a circuit view showing a gate voltage selector circuit according to a first embodiment.

In the gate voltage selector circuit 2 of the first embodiment shown in FIG. 3, high level of the gate input $v_2$ of the transistor $Q_{N0}$ for the output's sake is capable of being changed programmably from the outer section. Referring to FIG. 3, three selection signals $S_1$, $S_2$, and $S_3$ are established such that only any one thereof becomes high level (H), and remaining two thereof become low level (L). Now, supposing that selection signal S1 is "H", selection signal S2 is "L", and selection signal S3 is "L". In this case, the most upper stage in FIG. 3 shows a level shifter 7A to which voltage ($V_{DD}+\alpha$) is impressed, wherein the n-MOS transistor $Q_{N1}$ becomes ON state, while the n-MOS transistor $Q_{N2}$ becomes OFF state. For that reason, a drain level of the transistor $Q_{N1}$ becomes "L", and the "L" level is impressed to gate electrode of p-MOS transistor $Q_{P2}$ so that the p-MOS transistor $Q_{P2}$ becomes ON state, while the drain level of n-MOS transistor $Q_{N2}$ becomes ($V_{DD}+\alpha$). Furthermore, since there is implemented feed-back of the drain level ($V_{DD}+\alpha$) of the above n-MOS transistor $Q_{N2}$ toward the gate electrode of the n-MOS transistor $Q_{P1}$, the n-MOS transistor $Q_{P1}$ becomes OFF state completely, and the drain electrode of the n-MOS transistor $Q_{M1}$ becomes ground electric potential. Ultimately, p-MOS transistor $Q_{P7}$ of the output becomes ON state while being applied gate voltage of the ground electric potential.

On the other hand, in a level shifter 7B of intermediate stage, to which the voltage $V_{DD}$ is impressed, since control signal $S_2$ is "L", output of the inverter 6B becomes "H". For that reason, since the n-MOS transistor $Q_{N3}$ becomes OFF state, while the n-MOS transistor $Q_{N4}$ becomes ON state, the p-MOS transistors $Q_{P8}$, and $Q_{P9}$ of the output to which voltage ($V_{DD}+\alpha$) is impressed in terms of the gate electrode, thus becoming complete OFF state.

Further, in the level shifter 7C of the most lowest stage to which a voltage ($V_{DD}-\beta$) is impressed, a pair of outputting p-MOS transistors $Q_{P10}$, and $Q_{P11}$ become together OFF state completely that is the same state as that of the level shifter 7B of the intermediate stage.

As a result thereof, the gate voltage selector circuit 2 outputs the voltage ($V_{DD}+\alpha$) to an output point $N_1$. Namely, an output voltage $V_1$ equals $V_{DD}+\alpha$. Furthermore, in the gate voltage selector circuit, with respect to the n-MOS transistor of the output stage for selecting the output voltage $V_1$, when there is outputted the highest voltage ($V_{DD}+\alpha$), only transistor $Q_{P1}$ is used, while when there is outputted the voltage $V_{DD}$ or ($V_{DD}-\beta$) lower than the voltage ($V_{DD}+\alpha$), two p-MOS transistors are used as being paired such as the transistors $Q_{P8}$ and $Q_{P9}$, or the transistors $Q_{P10}$ and $Q_{P11}$, because they are to prevent reverse current from the output point $N_1$. Namely, supposing that the electric potential of the output point $N_1$ is ($V_{DD}+\alpha$) with the circuit as example of selecting the voltage $V_{DD}$ of the intermediate stage. The electric potential is higher than well electric potential (=$V_{DD}$) of the n-MOS transistor $Q_{P9}$ of the circuit of the intermediate stage. Consequently, if there is no p-MOS transistor $Q_{P9}$, the electric potential ($V_{DD}+\alpha$) of the output point $N_1$ is passed through to the well of the p-MOS transistor thus current flowing from the output point $N_1$. There is prevented the phenomena by providing the transistor $Q_{P9}$.

Next, in the cases where selection signals $S_1$, $S_2$, and $S_3$ are as being $S_1$="L", $S_2$="H", and $S_3$="L" respectively, the output of the inverter 6A becomes "H", thus the n-MOS transistor $Q_{N2}$ becomes ON state, while the n-MOS transistor $Q_{N1}$ becomes OFF state, then gate voltage level of the p-MOS transistor $Q_{P1}$ becomes ground electric potential. For that reason, the p-MOS transistor $Q_{P1}$ becomes ON state, subsequently, the p-MOS transistor $Q_{P7}$ for the output's sake, whose gate voltage becomes ($V_{DD}+\alpha$), is of the complete OFF state. Furthermore, the selection signal $S_2$ is "H", a pair of p-MOS transistors $Q_{P8}$, and $Q_{P9}$ for the output's sake become together ON state. Moreover, since the selection signal S3 is "L", the output of the inverter 7C becomes "H". For that reason, a pair of the p-MOS transistors $Q_{P1}$ and $Q_{P11}$ become OFF state completely while being compressed the voltage ($V_{DD}+\alpha$) to the gate electrode. As a result thereof, the voltage of the output point $N_1$ becomes as being $V_1=V_{DD}$.

Next, in the cases where selection signals $S_1$, $S_2$, and $S_3$ are as being $S_1$="L", $S_2$="L", and $S_3$="H" respectively, the output of the inverter 6A becomes "H", thus the n-MOS transistor $Q_{N2}$ becomes ON state, while the n-MOS transistor $Q_{N1}$ becomes OFF state, then gate voltage level of the p-MOS transistor $Q_{P1}$ becomes ground electric potential. For that reason, the p-MOS transistor $Q_{P1}$ becomes ON state, subsequently, the p-MOS transistor $Q_{P7}$ for the output's sake, whose gate voltage becomes ($V_{DD}+\alpha$), is of the complete OFF state. Furthermore, since the selection signal $S_2$ is "L", the output of the inverter 7B becomes "H". For that reason, a pair of p-MOS transistors $Q_{P8}$, and $Q_{P9}$ for the output's sake become together OFF state completely while being compressed the voltage ($V_{DD}+\alpha$) to the gate electrode. Moreover, since the selection signal S3 is "H", a pair of the p-MOS transistors $Q_{P10}$ and $Q_{P11}$ become together ON state. As a result thereof, the voltage of the output point $N_1$ becomes as being $V_1=(V_{DD}-\beta)$.

As described above, the gate voltage selector circuit of the present embodiment enables the output voltage to be selected in accordance with combination of the selection signals $S_1$, $S_2$, and $S_3$ from the outer section. Since there can be controlled programmably whether or not it causes which signal out of three selection signals to be high level, it is capable of being controlled the gate voltage in accordance with conditions. For instance, generally, there are established the selection signal $S_2$ into high level, and the gate input of the n-MOS transistor $Q_{N0}$ for the output's sake into the level of $V_{DD}$, at the time when there is detected a decrease of the power source $V_{DD}$ by a power source detection means (not illustrated) provided separately, the output current is capable of being obtained regardless of the decrease of the power source voltage, because if the program is a program which changes the selection signal $S_1$ into high level, since there is enhanced the gate input level of the transistor $Q_{N0}$ for the output's sake into ($V_{DD}+\alpha$).

Referring to FIG. 4, there is shown one example of a circuit view of the level conversion circuit 3. Referring to FIG. 4, when the source output signal $V_{out}$ is "L", n-MOS transistor $Q_{N7}$ becomes OFF state, while n-MOS transistor $Q_{N8}$ becomes ON state. For that reason, drain level of the transistor $Q_{N8}$ becomes "L", since the "L" level is impressed to the gate electrode of p-MOS transistor $Q_{P12}$ of the other side, the p-MOS transistor $Q_{P12}$ becomes ON state. As a result thereof, the drain level of the n-MOS transistor $Q_{N7}$ becomes $V_1$. Furthermore, since there is performed feedback such that the drain level $V_1$ of the above n-MOS transistor $Q_{N7}$ is impressed to the gate electrode of the p-MOS transistor $Q_{P13}$, the p-MOS transistor $Q_{P13}$ becomes OFF state completely, thus the drain electrode of the n-MOS transistor $Q_{N8}$ becomes ground electric potential. Finally, the electric potential $v_2$ of the output point $N_2$ becomes the electric potential $V_1$ which is, namely, the output level of the gate voltage selector circuit 2 of the front stage. While, when the source output signal $V_{out}$ is "H", the electric potential $v_2$ of the output point $N_2$ becomes ground level on the contrary.

In accordance with the above operation, the level conversion circuit 3 shown in FIG. 4 outputs the signal $v_2$ of the output point $N_2$ with the same frequency as the source output signal $v_{out}$. Namely, the level conversion circuit 3 converts the source output signal $v_{out}$ into the signal $v_2$ of the amplitude $V_1$.

Figure 6:
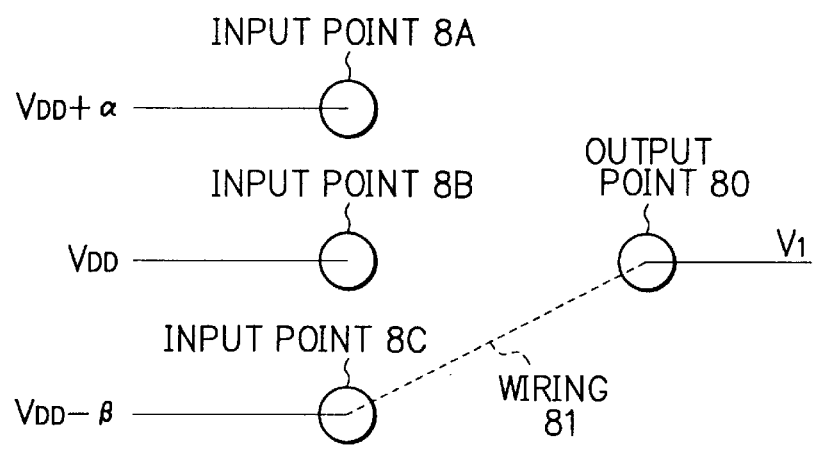
FIG. 6 is a circuit view showing a gate voltage selector circuit according to a second embodiment.

Next, referring to FIG. 6, there is shown the gate voltage selector circuit according to a second embodiment of the present invention. The gate voltage selector circuit enables selection of voltage to be changed by a mask option. Referring to FIG. 6, in the second embodiment, there is provided wiring 81 between any one of three input points 8A, 8B, and 8C (in this case; input point 8C) and the output point 80 by the mask option, at the intermediate process of manufacture. For that reason, there is selected any one of the voltage ($V_{DD}+\alpha$) which is impressed to the input point 8A from the outer section, the voltage $V_{DD}$ impressed to the input point 8B, and the voltage ($V_{DD}-\beta$) impressed to the input point 8C, thus it is capable of being inputted to the level conversion circuit of the next stage by way of output voltage $V_1$.

Since, it is capable of selecting by the mask option whether or not it permits which voltage to be selected as being output voltage $V_1$, it enables amplitude of the gate input of the transistor $Q_{N10}$ for the output's sake to be established in answer to the output current which is required by integrated circuit application device. The present second embodiment whose degree of freedom deteriorates has advantage of enabling circuit size to be diminished in comparison with the gate voltage selector circuit according to the first embodiment shown in FIG. 3.

Figure 7:
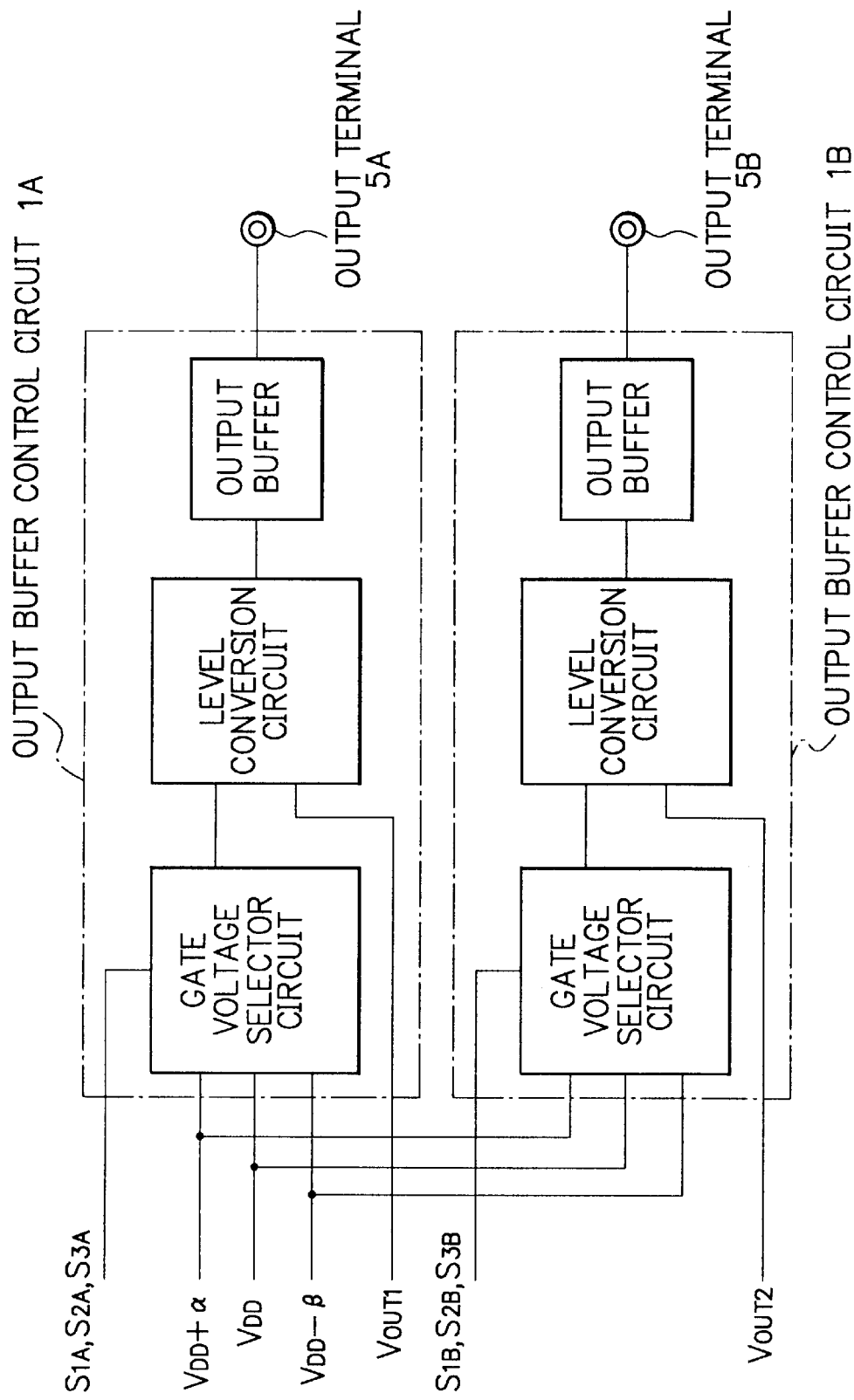
FIG. 7 is a block diagram showing a configuration of an output buffer control circuit according to a third embodiment.

Next, referring to FIG. 7, there is shown a block diagram of an output buffer control circuit according to a third embodiment of the present invention. The present embodiment is provided with a plurality of output buffer control circuits of the first embodiment, thus enabling it to cope with a plurality of output terminals. Referring to FIG. 7, there are provided two output buffer control circuits 1A, and 1B. Each of the control circuit 1A, 1B is the same output buffer control circuit as that of the first embodiment. Although two control circuits 1A, and 1B hold three voltages ($V_{DD}+\alpha$), $V_{DD}$, ($V_{DD}-\beta$) in common, the selection signals $S_1$, $S_2$, and $S_3$, the source output signals $v_{out1}$, and $v_{out2}$, and the output terminals 5A, and 5B are independent in every respective control circuits 1A, and 1B.

In the third embodiment, when there is implemented the program that the output buffer control circuit 1A whose selection signal $S_{1A}$ is "H", and that the output buffer control circuit 1B whose selection signal $S_{3B}$ is "H", it is capable of being changed quantity of the output current in every output terminal such that it causes the output current of the output terminal 5A to be large, while it causes the output current of the output terminal 5B to be small.

Figure 8:
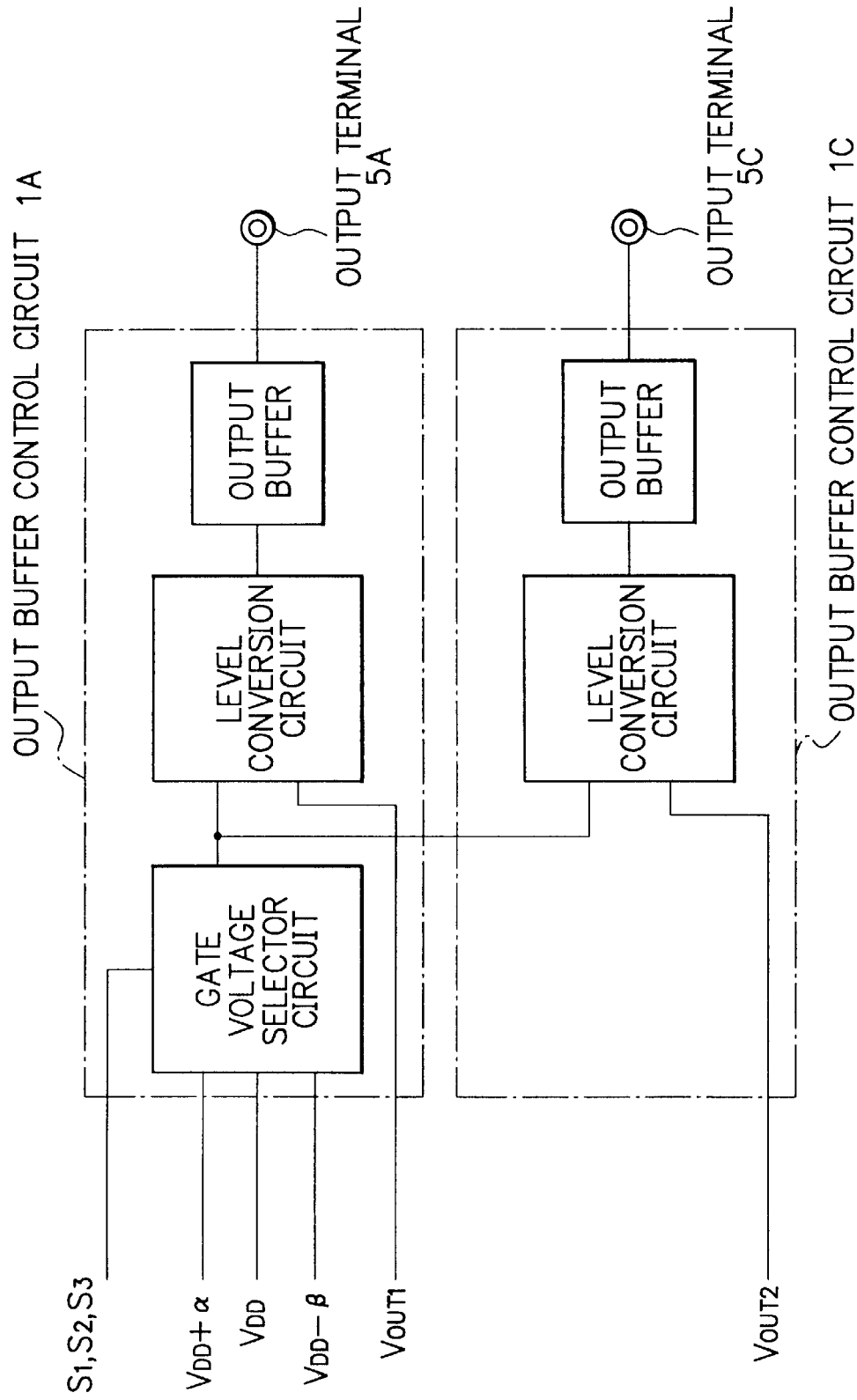
FIG. 8 is a block diagram showing a configuration of an output buffer control circuit according to a fourth embodiment.

FIG. 8 is a block diagram showing an output buffer control circuit according to a fourth embodiment of the present invention. Referring to FIG. 8, The present embodiment is provided with two output buffer control circuits 1A, and 1C. However, configuration of respective control circuits is different in that control circuit 1A thereof is the same as that of the first embodiment while control circuit 1C has configuration with the exception of the gate voltage selector circuit. There is held one gate voltage selector circuit in common to two control circuits such that it causes the output of the gate voltage selector circuit 2 of the control circuit 1A to be inputted to also the level conversion circuit of the control circuit 1C. In the output buffer control circuit of the present embodiment, it is incapable of differing in quantity of the output current in every output terminal because two output terminals 5A and 5B have the same quantity of the output current. However, there is advantage of enabling the circuit size to be reduced.

Further, in the whole embodiments, the three kinds of direct current voltages impressed from the outer section are the voltage ($V_{DD}+\alpha$) higher than the power source voltage, the power source voltage $V_{DD}$, or the voltage ($V_{DD}-\beta$) lower than the power source voltage. However, the present invention is not limited by these matters. When the number of input direct current is plural more than two, there can be obtained the same operation and effect as those of the embodiment. In this case, in order to use programmable gate voltage selector circuit, there is used binary control signal with the same number as that of the input direct current voltage by way of the selection signal for the sake of the program. There is implemented the program that only one of those plural selection signals becomes inversion state to another selection signals. Furthermore, it is unnecessary to be voltage of the power source voltage and voltages distributed separately high or low thereof. There can be used only voltages higher than the power source voltage, or only voltages lower than the power source voltages in the present invention.

As described above, according to the present invention, the output buffer control circuit is provided with the voltage selection means for selecting one voltage of a higher voltage than the power source voltage, the power source voltage, and a lower voltage than the power source voltage impressed from the outer section, and the level conversion means for converting the amplitude of the source output signal to be outputted from the voltage level of the power source into a voltage level selected by the voltage selection means by communicating the selected voltage by way of a gate input of the MOS transistor for the output's sake in answer to the signal to be outputted to the outer section.

For that reason, according to the present invention, an amplitude of the gate input of the MOS transistor for the output's sake is variable in accordance with a program of the respective users or with a mask option, and it is capable of being supplied the optimum output current to the integrated circuit application device, thus it is capable of being provided the output buffer control circuit without electromagnetic interference and unnecessary current consumption.

The output buffer control circuit in which the gate voltage of the MOS transistor for the output's sake is variable, and voltage is capable of being changed into a plurality of output currents required by application devices, it is capable of being enhanced versatility of the integrated circuit while applying to universal integrated circuit.

While preferred embodiments of the invention have been described using specific terms, such description is for illustrative purpose only, and it is to be understood that changes and variations may be made without departing from the spirit or scope of the following claims.

What is claimed is:

1. An output buffer control circuit comprising:
    a plurality of voltage source terminals to which direct current voltages whose respective voltage values are different from one another are inputted;
    an insulated gate field-effect transistor for supplying current to an output terminal;
    a voltage selection means for selecting one voltage out of a plurality of direct current voltages inputted to said plurality of voltage source terminals; and
    a means for inputting an output voltage of said voltage selection means to a gate electrode of said insulated gate field-effect transistor accompanying with the same cycle as that of a source output signal in answer to said source output signal to be outputted to outer section.

2. An output buffer control circuit as claimed in claim 1, wherein the output voltage of said voltage selection means is a voltage which is selected in the manufacturing process to be fixed.

3. An output buffer control circuit as claimed in claim 1, wherein the output voltage of said voltage selection means is capable of being changed selectively into any one of said plurality of said direct current voltages in accordance with a programmed control signal from the outer section.

4. An output buffer control circuit comprising:
    a plurality of voltage source terminals to which direct current voltages whose respective voltage values are different from one another are inputted;
    an insulated gate field-effect transistor for the output's sake supplying current to an output terminal;
    a level conversion means to which there are inputted any one voltage out of a plurality of direct current voltages inputted to said plurality of voltage source terminals, and a source output signal to be outputted through said insulated gate field-effect transistor for the output's sake inputted from the outer section, for supplying said inputted one voltage with the same cycle as that of said source output signal in answer to said source output signal by way of a gate input of said insulated gate field-effect transistor, while for interrupting said inputted one voltage if not; and an electrical wiring provided between any one of said plurality of voltage source terminals and a voltage input point of said level conversion means.

5. An output buffer control circuit comprising:

a plurality of voltage source terminals to which direct current voltages whose respective voltage values are different from one another are inputted;

a voltage selection means for selecting one voltage out of a plurality of direct current voltages inputted to said plurality of voltage source terminals in answer to a programmed control signal inputted from the outer section;

an insulated gate field-effect transistor for the output's sake supplying current to output terminals; and a level conversion means intervening between said voltage selection means and said insulated gate field-effect transistor for the output's sake, for supplying a voltage which said voltage selection means selects to be outputted with the same cycle as that of said source output signal in answer to the source output signal to be outputted through said insulated gate field-effect transistor for the output's sake by way of a gate input of the insulated gate field-effect transistor for the output's sake, while for interrupting said voltage if not.

6. An output buffer control circuit as claimed in claim 5, wherein there is provided a first output buffer control circuit consisting of said output buffer control circuit described in claim 5, and a second output buffer control circuit consisting of said level conversion means and said insulated gate field effect transistor for the output's sake described in claim 5, in which there is connected a voltage input point of the level conversion means of said first output buffer control circuit to voltage input point of the level conversion means of said second output buffer control circuit in common therewith, thus causing the voltage selection means of said first output buffer control circuit to be held in common by both of said first output buffer control circuit and said second output buffer control circuit.

7. An output buffer control circuit as claimed in claim 5, wherein there are provided a plurality of output buffer control circuits, and there are connected corresponding voltage source terminals respectively in common among respective output buffer control circuits.

8. An output buffer control circuit comprising:

voltage source terminals of N (N is natural number more than 2) pieces, to which direct current voltages whose respective voltage values are different from one another are inputted;

n-channel MOS field-effect transistor for the output's sake, which is connected so as to provide a current path between the output terminal and the grounded electric potential point;

a voltage s election means provided with N sets of change-over circuits including p-channel MOS field-effect transistor and an analog switch for performing ON-OFF in terms of a gate electrode of said p-channel MOS field-effect transistor and a high voltage source in accordance with binary control signal from an outer section, for applying a voltage of a voltage source terminal of the maximum electric potential to said high voltage source of respective said change-over circuits, for assigning to be applied N pieces of direct current voltages inputted to said N pieces of voltage source terminals toward a source electrode of said p-channel MOS field-effect transistor of respective said change-over circuits, and for assigning to be applied N pieces of binary control signals from the outer section by way of said binary control signal of respective said change-over circuits, and causing a drain electrode of said p-channel MOS field-effect transistor of respective said change-over circuit to be connected in common; and a level conversion means provided between a voltage source and a gate electrode of said n-channel MOS field-effect transistor for the output's sake, as being level conversion means consisting of switches performed ON-OFF in accordance with a source output signal to be outputted to the outer section through said n-channel MOS field-effect transistor for the output's sake, and said voltage source is connected to common drain electrode of N pieces p-channel MOS field-effect transistor of said voltage selection means.

9. An output buffer control circuit comprising:

voltage source terminals of N (N is natural number more than 2) pieces, to which direct current voltages whose respective voltage values are different from one another are inputted;

an n-channel MOS field-effect transistor for the output's sake, which is connected so as to provide a current path between the output terminal and the grounded electric potential point;

a voltage selection means provided with N sets of change-over circuits generating binary control signal in answer to said binary control signal by changing two current paths provided in parallel between high-level voltage source and grounded electric potential point using binary control signal from the outer section and an inversion signal thereof, and controlling ON-OFF of p-channel MOS field-effect transistor using the generated binary control signal, for applying a voltage of a voltage source terminal of the maximum electric potential to said high voltage source of respective said change-over circuits, for assigning to be applied N pieces of direct current voltages inputted to said N pieces of voltage source terminals toward a source electrode of said p-channel MOS field-effect transistor of respective said change-over circuits, and for assigning to be applied N pieces of binary control signals from the outer section by way of said binary control signal of respective said change-over circuits, and causing a drain electrode of said p-channel MOS field-effect transistor of respective said change-over circuit to be connected in common; and a level conversion means in which said voltage source is connected to common drain electrode of N pieces of p-channel MOS field-effect transistor of said voltage selection means, as being a level conversion means for generating binary control signal whose cycle is the same as said source output signal and whose amplitude has the same high level as voltage of said voltage source and for applying by way of a gate input of the n-channel MOS field-effect transistor for the output's sake, by changing current path provided in parallel between the voltage source and the grounded electric potential point by means of source output signal and inversion signal generated therefrom while inputting the source output signal to be outputted through the n-channel MOS field-effect transistor for the output's sake.

10. An output buffer control circuit as claimed in claim 1, wherein a plurality of voltage source terminals to which the direct current voltages whose voltage values are different from one another are inputted, comprise a voltage source terminal to which there is inputted the power source voltage, a voltage source terminal to which there is inputted the direct current voltage higher than the power source voltage, and a voltage source terminal to which there is inputted the direct current voltage lower than the power source voltage.

11. An output buffer control circuit as claimed in claim 2, wherein a plurality of voltage source terminals, to which the direct current voltages whose voltage values are different from one another are inputted, comprise a voltage source terminal to which there is inputted the power source voltage, a voltage source terminal to which there is inputted the direct current voltage higher than the power source voltage, and a voltage source terminal to which there is inputted the direct current voltage lower than the power source voltage.

12. An output buffer control circuit as claimed in claim 3, wherein a plurality of voltage source terminals, to which the direct current voltages whose voltage values are different from one another are inputted, comprise a voltage source terminal to which there is the power source voltage, a voltage source terminal to which there is inputted the direct current voltage higher than the power source voltage, and a voltage source terminal to which there is inputted the direct current voltage lower than the power source voltage.

13. An output buffer control circuit as claimed in claim 4, wherein a plurality of voltage source terminals, to which the direct current voltages whose voltage values are different from one another are inputted, comprise a voltage source terminal to which there is the power source voltage, a voltage source terminal to which there is inputted the direct current voltage higher than the power source voltage, and a voltage source terminal to which there is inputted the direct current voltage lower than the power source voltage.

14. An output buffer control circuit as claimed in claim 5, wherein a plurality of voltage source terminals, to which the direct current voltages whose voltage values are different from one another are inputted, comprise a voltage source terminal to which there is the power source voltage, a voltage source terminal to which there is inputted the direct current voltage higher than the power source voltage, and a voltage source terminal to which there is inputted the direct current voltage lower than the power source voltage.

15. An output buffer control circuit as claimed in claim 6, wherein a plurality of voltage source terminals, to which the direct current voltages whose voltage values are different from one another are inputted, comprise a voltage source terminal to which there is the power source voltage, a voltage source terminal to which there is inputted the direct current voltage higher than the power source voltage, and a voltage source terminal to which there is inputted the direct current voltage lower than the power source voltage.

16. An output buffer control circuit as claimed in claim 7, wherein a plurality of voltage source terminals, to which the direct current voltages whose voltage values are different from one another are inputted, comprise a voltage source terminal to which there is the power source voltage, a voltage source terminal to which there is inputted the direct current voltage higher than the power source voltage, and a voltage source terminal to which there is inputted the direct current voltage lower than the power source voltage.

17. An output buffer control circuit as claimed in claim 8, wherein a plurality of voltage source terminals, to which the direct current voltages whose voltage values are different from one another are inputted, comprise a voltage source terminal to which there is the power source voltage, a voltage source terminal to which there is inputted the direct current voltage higher than the power source voltage, and a voltage source terminal to which there is inputted the direct current voltage lower than the power source voltage.

18. An output buffer control circuit as claimed in claim 9, wherein a plurality of voltage source terminals, to which the direct current voltages whose voltage values are different from one another are inputted, comprise a voltage source terminal to which there is the power source voltage, a voltage source terminal to which there is inputted the direct current voltage higher than the power source voltage, and a voltage source terminal to which there is inputted the direct current voltage lower than the power source voltage.

\* \* \* \* \*